(12) United States Patent
Dietrich

(10) Patent No.: US 12,087,660 B2
(45) Date of Patent: Sep. 10, 2024

(54) METAL-CERAMIC SUBSTRATE WITH A FOIL FORMED FOR DIRECT COOLING AS SUBSTRATE BOTTOM

(71) Applicant: Heraeus Deutschland Gmbh & Co. KG, Hanau (DE)

(72) Inventor: Peter Dietrich, Hanau (DE)

(73) Assignee: Heraeus Deutschland GmbH & Co. KG, Hanau (DE)

( * ) Notice: Subject to any disclaimer, the term of this patent is extended or adjusted under 35 U.S.C. 154(b) by 697 days.

(21) Appl. No.: 17/259,406

(22) PCT Filed: Jul. 11, 2019

(86) PCT No.: PCT/EP2019/068642
§ 371 (c)(1),
(2) Date: Jan. 11, 2021

(87) PCT Pub. No.: WO2020/011905
PCT Pub. Date: Jan. 16, 2020

(65) Prior Publication Data
US 2021/0125895 A1 Apr. 29, 2021

(30) Foreign Application Priority Data
Jul. 12, 2018 (EP) .................................. 18183126

(51) Int. Cl.
| H01L 23/373 | (2006.01) |
| H05K 1/02 | (2006.01) |
| H05K 1/03 | (2006.01) |
| H05K 1/05 | (2006.01) |
| H05K 1/18 | (2006.01) |

(52) U.S. Cl.
CPC ....... *H01L 23/3735* (2013.01); *H05K 1/0201* (2013.01); *H05K 1/0306* (2013.01); *H05K 1/053* (2013.01); *H05K 1/188* (2013.01)

(58) Field of Classification Search
CPC .............. H01L 23/3735; H05K 1/0201; H05K 1/0306; H05K 1/053; H05K 1/188
USPC ........................................................ 257/762
See application file for complete search history.

(56) References Cited

U.S. PATENT DOCUMENTS

| 6,426,154 B1 * | 7/2002 | Naba ....................... H01L 23/13 |
| | | 428/629 |
| 8,927,873 B2 | 1/2015 | Hori et al. |
| 8,929,071 B2 | 1/2015 | Beaupre et al. |
| 9,642,247 B2 | 5/2017 | Schmidt et al. |

(Continued)

FOREIGN PATENT DOCUMENTS

| CN | 104755445 | 7/2015 |
| DE | 10 2013 113 736 | 6/2015 |

(Continued)

OTHER PUBLICATIONS

International Preliminary Report on Patentability and Written Opinion in PCT Application No. PCT/EP2019/068642 dated Jan. 12, 2021.

*Primary Examiner* — Tu-Tu V Ho
(74) *Attorney, Agent, or Firm* — Dicke, Billig & Czaja, PLLC

(57) ABSTRACT

Described is a metal-insulator substrate, which provides a structuring of the metallization for direct cooling. Furthermore, a process for manufacturing this metal-insulator substrate is described.

14 Claims, 5 Drawing Sheets

(56) References Cited

U.S. PATENT DOCUMENTS

Figure 1:
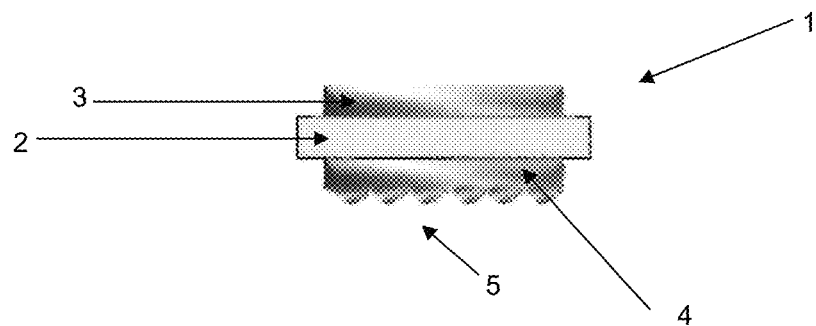

| | | | |
|---|---|---|---|
| 9,730,310 | B2 | 8/2017 | Meyer et al. |
| 2004/0062009 | A1 | 4/2004 | Osanai et al. |
| 2014/0345914 | A1* | 11/2014 | Meyer .................. C04B 37/008 156/60 |
| 2022/0285173 | A1* | 9/2022 | Schmidt ................. H01L 24/24 |

FOREIGN PATENT DOCUMENTS

| | | |
|---|---|---|
| EP | 2200080 | 6/2010 |
| EP | 2525638 | 11/2012 |
| JP | 2008135511 | 6/2008 |
| KR | 10-0944373 | 2/2010 |
| WO | 2013/120486 | 8/2013 |

* cited by examiner a) b)

METAL-CERAMIC SUBSTRATE WITH A FOIL FORMED FOR DIRECT COOLING AS SUBSTRATE BOTTOM

CROSS REFERENCE TO RELATED APPLICATION

This Utility Patent Application claims priority under 35 U.S.C. § 371 to International Application Serial No. PCT/EP2019/068642, filed Jul. 11, 2019, which claims the benefit of European Patent Application No. 18183126.4, filed Jul. 12, 2018; which are both incorporated herein by reference.

The present invention relates to a metal-ceramic substrate with direct cooling. A further object of the present invention is a process for the production and use of the metal-ceramic substrate according to the invention.

STATE OF THE ART

Metal-ceramic substrates, especially those in the form of printed circuit boards for electrical and electronic circuits or modules, as well as methods of manufacturing such metal-ceramic substrates are generally known. Usually, these substrates consist of a ceramic insulating layer, which is provided with a metallization on each of its two surface sides. The metallization is usually formed by a metal foil, e.g. of copper or a copper alloy, which is bonded to the ceramic insulating layer over its entire surface by means of a suitable process.

A known process for creating a stable connection between the ceramic substrate and the metal foil, is for example the DCB (Direct Copper Bond) process. In this DCB process for bonding copper foils and ceramics, the copper of the copper foil is first oxidized on the surface to copper oxide ($Cu_2O$). The melting point of copper oxide ($Cu_2O$) is lower than the melting point of pure copper and the copper foil coated with copper oxide is placed on the surface of the ceramic substrate and heated in an oven. In the melt, the lower side of the copper foil, which is made of copper oxide, joins with the ceramic surface. This DCB process generally has the following process steps:

(a) surface oxidation of a copper foil in such a way that a uniform copper oxide layer is formed;
(b) placing the copper foil on the ceramic layer;
(c) heating the composite to a process temperature between about 1025 to 1083° C.; and
(d) cooling to room temperature.

Analogous to the aforementioned DCB process for the direct bonding of copper and ceramics (also known as direct bonding), other processes or technologies are also known with which it is possible to bond metal layers to ceramics or ceramic layers in a similar way.

Well known is for example the so-called active soldering process for joining metal layers or metal foils forming metallizations, especially copper layers or copper foils or aluminum layers or aluminum foils, with a ceramic material. In this process, at a temperature generally between 800 and 1000° C., a connection is made between a metal foil, for example copper foil, and a ceramic substrate, for example an aluminum nitride ceramic, using a brazing alloy which contains an active metal in addition to a main component such as copper, silver and/or gold. This active metal, which is for example at least one element of the group Hf, Ti, Zr, Nb, Ce, forms a connection between the solder and the ceramic by chemical reaction, while the connection between the solder and the metal is a metallic brazing connection.

Another way of producing metal-ceramic substrates is the method described in WO 2017/108939 A, according to which a thick film paste is applied either to the ceramic substrate or the metal foil and then the ceramic substrate and the metal foil are joined together.

The DCB process and the other processes for manufacturing metal-ceramic substrates, such as in particular the AMB process and the TFCB process, are generally referred to as the MCS process (MCS=metal ceramic substrate). In the present invention, the terms metal-insulator substrate and metal-ceramic substrate (MCS) are used synonymously.

The fields of application of metal-ceramic substrates range from applications in the field of power electronics, such as wind power plants, traction, drives, pumps, automotive, etc., to applications in the field of sensor technology and LED, i.e., wherever modules must remain permanently functional in large temperature ranges and under very high currents and current pulses. They can be found, for example, in IGBT or MOSFET transistor modules, in frequency converters or in current converters. With a coefficient of thermal expansion close to that of silicon, they are suitable for chip-on-board connections. The heat generated during switching of the components must, as already mentioned above, be dissipated via the substrate, which is initially made possible by the high thermal conductivity of the ceramic, combined with the high heat capacity and heat spread of copper.

In the case of the known metal-ceramic substrates, the "second" metallization, i.e. the metallization opposite the metallization forming the electronic circuits, usually forms an intermediate layer which, in particular, enables a connection to a metallic base plate and causes an improved thermal transition between the ceramic layer and this metallic base plate, on which the metal-ceramic substrate is arranged and which in turn is connected to a cooling element or a heat sink. The connection between the metal-ceramic substrate and the base plate is, for example, a solder or sinter connection.

Corresponding metal-ceramic substrates equipped with separate cooling elements are known from the publication EP 0 751 570 A, for example, in which it is described that the cooling element is screwed under a metal-ceramic substrate.

The publication U.S. Pat. No. 5,847,929 also refers to a metal-ceramic substrate in which a separate cooling element is bonded to the metal-ceramic substrate by a silicone-containing adhesive layer.

The publication DE 10 2009 045 063 A describes a metal-ceramic substrate with a separate molded-on cooling element.

US 2012/0282454 A describes a metal-ceramic substrate with a separate cooling element made of a foam material.

U.S. Pat. No. 5,200,641 describes a metal-ceramic substrate in which a separate complex composite body is used on the metal layer, also as a cooling element.

However, the use of separate cooling elements, with which the metal-ceramic substrate is thermally bonded, is disadvantageous in that they require a large amount of space and a separate process step of bonding the metal-ceramic substrate and the separate cooling element.

Metal-ceramic substrates with direct cooling are also known from the state of the art. Direct cooling is understood to mean that one of the two metallizations has structural elements that deviate from a plane structure and that can be in contact with a cooling medium.

Especially for automotive applications and traction applications (applications in the field of railroad technology) such a direct cooling of the metal-ceramic substrates is preferred. Here, instead of a flat base plate, a cooling element is used in which the bottom is shaped in such a way that it can be directly flushed with a cooling medium. This cooling element is connected to the ceramic substrate via the metallization of the metal-ceramic substrate (i.e. the bottom plate is directly formed with a cooler structure). Thus, the thermal path around the connection base plate to cooler by means of heat-conducting paste is shortened and heat-conducting pastes are no longer necessary. Although it is true that the reliability of the resulting metal-ceramic substrates is improved by direct cooling, since the heat-conducting paste poses an additional risk due to mobility, aging and pump-out effect, the production of corresponding power modules is costly due to the use of separate metallization and structured bottom plate.

Such a metal-ceramic substrate is also described, for example, in the publication WO 2013/120486 A, in which a metal-ceramic substrate and a process for its manufacture are proposed, wherein the metal-ceramic substrate comprises at least one ceramic layer, which is provided with at least one first metallization on a first surface side and with a second metallization on a second surface side opposite the first surface side. The second metallization on the bottom of the ceramic layer is necessarily made of aluminum or an aluminum alloy and is simultaneously designed as a cooling element. This second aluminum-containing metallization serving as cooling element, is basically produced according to the doctrine of WO 2013/120486 A by creating first a completely planar second metallization of aluminum or an aluminum alloy on the ceramic substrate and then creating the structural elements required for cooling, i.e. cooling elements protruding outwards, by partial removal of the second metallization. In the publication WO 2013/120486 A, the metallization is removed by etching, laser treatment and/or mechanical processing, as for example by sawing. Therefore, the application of the teaching of WO 2013/120486 A requires the execution of further processing steps after the production of the second metallization in order to form the second metallization as a cooling element. Furthermore, the resulting height of the cooling elements can correspond to the layer thickness of the second metallization at most, since the cooling elements are formed by a partial removal of this second metallization. The layer thickness of the second metallization of aluminum or an aluminum alloy is 1.00 mm at the most, so that the cooling elements formed by removal can have a maximum height of less than 1.00 mm.

In addition, power semiconductor modules with metal-ceramic substrates with indirect cooling (with heat-conducting pastes) have become established in recent years, especially in automotive applications. Corresponding metal-ceramic substrates can be used modularly and offer advantages in terms of cost and weight due to the material savings.

Power semiconductor modules, which have an organic intermediate layer instead of a ceramic electrical insulator, have also become established. The organic intermediate layer can, for example, be a dielectric insulation film as used in the power module according to DE 10 2011 088 218 A1. Here, the dielectric insulation film is fixed to a cooling element by means of adhesive layers. Although this prior art design does without a base plate, it requires a separate adhesive layer and a separate cooling element.

Based on this state of the art, the present invention has the task of providing metal-insulator substrates which have a simpler structure and can still be cooled effectively.

These metal-insulator substrates should preferably enable a cost-effective production of corresponding power modules. This is realized in particular by the fact that there is little or no material loss during the production of the metal-insulator substrate of the invention or during the structuring of the second metallization of the metal-insulator substrate of the invention, as shown below.

Furthermore, these metal-insulator substrates should preferably have a compact design and, in particular, should be able to do without the relatively large cooling elements (or heat sinks) conventionally used. The sintering or soldering of a chip, which has an integrated system (substrate+existing metallization designed as cooling element), is easier in comparison to a system, which has a substrate and a separately connected cooling element, because comparatively less thermal mass is introduced in the process. The introduction of less thermal mass in turn has an effect on the process time, on the accuracy of the temperature profile of the process and on the deflection of the entire system.

According to the invention, the above tasks are solved by a metal-insulator substrate, comprising
  a. an insulator substrate with an upper and a bottom side;
  b. a first metallization on the upper side of the insulator substrate, which is intended for the formation of a circuit electronics or is provided with at least one circuit electronics; and
  c. a second metallization on the bottom side of the insulator substrate;
whereby
    the second metallization of the metal-insulator substrate according to the invention is designed as a cooling element,
    the second metallization for direct cooling is provided with a structuring in such a way that the area of the second metallization available for cooling is increased by embossments in comparison with a planar structure of the second metallization, and the embossments have a height of at least 700 μm.

Thus, according to the invention, the metallization of the insulator substrate opposite the circuit electronics directly functions as a cooling element or heat sink. A connection of a separate cooling element, for example via a metallic base plate, or the use of a base plate designed as a cooling element is preferably not provided according to the present invention.

In the context of the present invention, a metallization formed as a cooling element is understood to be a metallization which enables an active cooling of the metal-insulator substrate; active cooling in turn preferably means that the metallization is in direct contact with a cooling medium. The cooling medium is, as explained in more detail below, preferably liquid or gaseous, more preferably liquid.

Before describing the present invention in more detail, the following terms of the present invention are explained in more detail.

The metal-insulator substrate according to the invention has at least one metallization on the upper side and at least one metallization on the bottom side of the insulator substrate. The use of the terms upper and bottom side of the insulator substrate does not represent a spatial preference for surfaces of the metal-insulator substrate, but only serves to differentiate the two surfaces of the insulator substrate. These two surfaces of the insulator substrate, on which the two metallizations are provided, are arranged opposite to each other, are separated from each other by the insulator substrate and usually represent the largest surfaces of the insulator substrate in terms of area.

Furthermore, the term "planar structure" of the second metallization is only used as a theoretic reference and does not necessarily imply that a planar structure must be present in the second metallization.

The first metallization on one side of the insulator substrate, in this case called the top side of the insulator substrate, is used to form the circuit electronics. For example, power and logic components, but also structuring of conductor tracks and contact areas and/or mounting areas for electronic components are provided on this first metallization.

The second metallization on the other side of the insulator substrate (opposite to the first metallization), in this case called bottom side of the insulator substrate, serves for direct cooling of the metal-insulator substrate.

Thus, according to the present invention the cooling element is an integral part of the metal-insulator substrate; consequently, in the context of the present invention, a separately formed cooling element to which the metal-insulator substrate is connected, is generally omitted. A special embodiment of the present invention thus does not include a separately formed cooling element to which the metal-insulator substrate is connected.

The insulation layer of the metal-insulator substrate according to the invention is not subject to any restrictions as long as the insulation layer functions as a sufficient dielectric.

In a first configuration, the insulating layer which is present between the first and second metallization, can be a ceramic layer (ceramic substrate). In this case a metal-ceramic substrate results.

In a second configuration of the present invention, the insulation layer is a metal substrate coated with an organic insulator, as distributed by Mitsubishi Electric Corporation.

In a third configuration of the present invention, it can be a plastic insulation layer, for example a plastic film.

Power modules, comprising the metal-insulation substrates according to the invention, are less expensive to manufacture, since the separate production of a cooling element and the step of connecting the metal-insulation substrate and the cooling element can be omitted.

The second metallization with the cooling structure has such a layer thickness that the resulting metal-insulator substrate with direct cooling in the concrete application requires significantly less space than a conventional metal-insulator substrate with a separate cooler.

In the following, preferred embodiments of the metal-insulator substrate are described.

In the present invention, a metal-insulator substrate as described above is claimed, i.e. an insulator substrate with metallizations on both sides of the insulator substrate, with a cooling medium in contact with one of the two metallizations. This cooling medium can be gaseous or liquid, but preferably liquid.

In the context of the present invention, the second metallization is provided with a structure for direct cooling. This structuring serves to increase the surface area of the second metallization available for cooling—compared to a planar structure of the second metallization—so that cooling by a cooling medium in contact with this surface is efficiently enabled. This cooling medium can be gaseous or liquid, but preferably liquid.

The structuring of the second metallization for direct cooling can be designed in a first version in such a way that in some areas the second metallization is partially or completely removed compared to a planar structure of the second metallization and the used cooling medium reaches the insulator substrate in these areas. An embodiment in which the cooling medium reaches up to the insulator substrate can be achieved, for example, if the second metallization is formed from a pre-structured, for example punched, metal foil from which a part of the metallization has been removed from the original metal foil plane by punching, so that finally recesses result in the second metallization.

Figure 9:
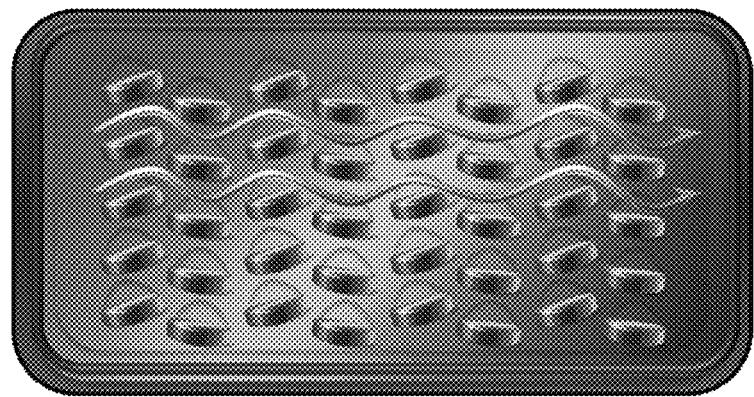

In a second version, the second metallization is formed from a pre-structured metal foil produced by embossing without completely removing areas of the metallization. According to this embodiment, the second metallization is formed in such a way that the side of the second metallization facing away from the insulator substrate has protruding embossments, whereby the side of the second metallization facing the insulator substrate has cavities corresponding to these embossments. The angle of the embossments according to the invention allows targeted turbulences of the cooling medium to be achieved which promote the effectiveness of the cooling. A corresponding illustration of such a structuring of the second metallization is shown in FIG. 9.

Figure 11A:
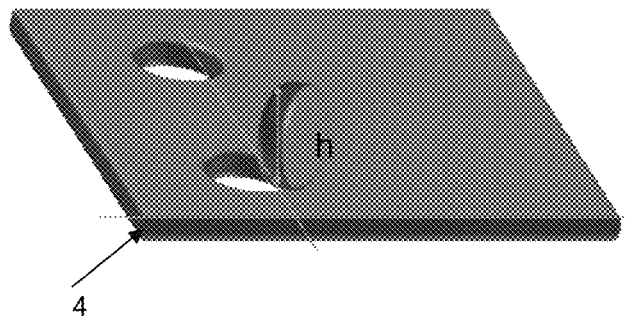
Figure 11B:
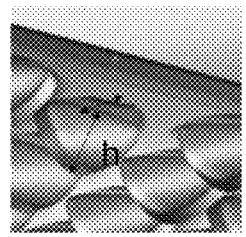

In a further third version, the second metallization is formed from a pre-structured metal foil produced by "partial punching and/or bending" without, however, removing areas of the metallization. According to the present invention, "partial punching and/or bending" is understood to mean the removal of partial areas from the second metallization, whereby no removal of the metallization in the sense of ablation of the metallization takes place. The raised part (by folding up) remains connected to the second metallization and is bent so that this partial area protrudes from the second metallization and thus increases its surface area. The "separated" part (folded up part) leaves recesses at these points which can reach up to the insulator substrate. Since, as mentioned above, no removal of mass in the sense of ablation takes place during this process, the mass of the second metallization remains unchanged before and after the "partial punching and bending". A corresponding illustration to explain this structuring is shown in FIG. 11.

The above process can be further optimized by adjusting the deflection over the thickness and over the punching rate of the metal foil provided for structuring.

In a preferred embodiment, the second metallization already shows, before being applied to the insulator substrate, structures in the form of recesses and/or embossments according to the above embodiments, preferably formed by a punching process, a stamping process or by a process of partial punching and/or bending (as described above).

In this respect, the teaching on which the present invention is based differs from the counterpart WO 2013/120486 A, in which first a flat unstructured second metallization is applied to an insulator substrate and then, by a kind of subtraction, areas of the second metallization are removed again. According to the invention, even partial removal of areas of the second metallization is not intended. The use of a pre-structured foil as second metallization for the production of a metal-ceramic substrate with direct cooling is also not possible in WO 2013/120486 A. In a preferred embodiment of this structuring on the opposite side of the circuit electronics (second metallization), a structuring is provided in such a way that flow and/or cooling channels are created, through which a cooling medium can flow. These flow or cooling channels are thereby limited by the second metallization or the insulator substrate and protrude into a closed system, for example made of metal, which is provided with connections for the cooling medium.

In a preferred embodiment, the second metallization is formed by a copper or aluminum foil, preferably a copper foil, in which the cooling structures are embossed, punched or partially punched before being connected to the insulator substrate.

Figure 5:
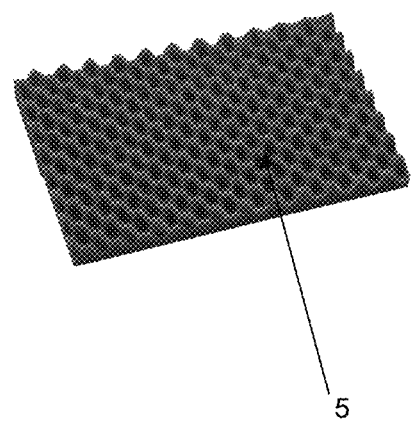

In a further configuration of the structuring of the second metallization of the metal-insulator substrate according to the invention, a concave-convex structure is provided; a corresponding representation of this structuring of the second metallization on the side facing away from the isolator substrate is shown in FIG. 5.

In a further configuration of the structuring of the second metallization of the metal-insulator substrate according to the invention, needles are provided.

Figure 6:
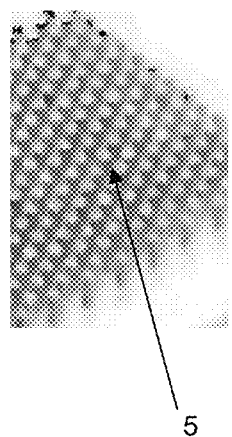

A further structuring configuration of the second metallization of the metal-insulator substrate according to the invention is a pin-fin structure; a corresponding illustration of this structuring of the second metallization on the side facing away from the insulator substrate is shown in FIG. 6.

Figure 13:
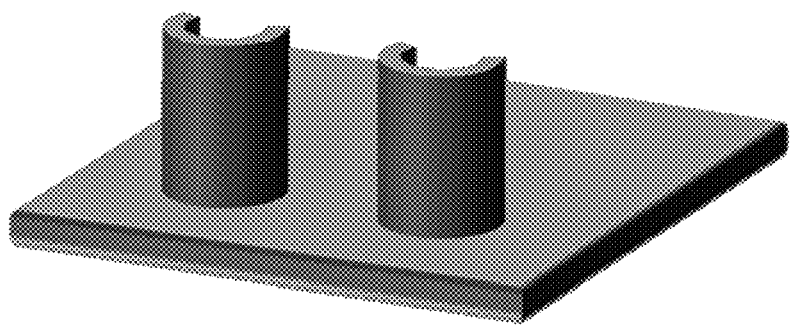
Figure 14:
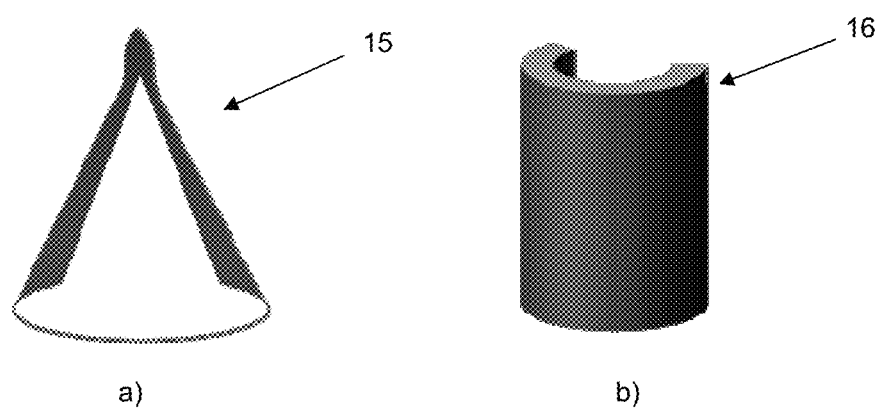

In a further configuration of the structuring of the second metallization of the metal insulator substrate according to the invention, in particular if a metal foil is used in the process according to the invention which is already structured, a shaping of the embossments with roundings is provided which serve to stabilize the embossments during the bonding so that the metal (e.g. Cu) which is soft due to the heat of the bonding does not collapse. A corresponding illustration of this structuring with roundings of the second metallization on the side facing away from the insulator substrate is shown in FIG. 13. FIG. 14 shows examples of pins with roundings of different shapes.

The production of metal-insulator substrates is usually performed by a direct metal bonding process in a bonding furnace; the basic features of the corresponding process steps have already been explained above and are known to the expert in the underlying technical field. The metallization on both sides of the insulator substrate is usually done starting from a metal foil. Therefore, the present invention preferably provides that the second metallization, which serves to form the direct cooling structure, is also formed by a foil.

The second metallization, which comprises the structuring used for cooling, usually has a layer thickness of at least 700 μm, preferably at least 800 μm, even more preferably at least 900 μm, even more preferably at least 1000 μm, even more preferably more than 1000 μm.

Other suitable coating thicknesses are 100 to 3000 μm, preferably 500 to 3000 μm, even more preferably 800 to 3000 μm, even more preferably 1000 to 3000 μm, even more preferably more than 1000 to 3000 μm.

Other preferred layer thicknesses of the second metallization are 100 to 1500 m, preferably 150 to 1200 μm, still further preferred 200 to 800 μm.

Individual areas of the second metallization can be completely removed (first case) or protruding from the original metal foil plane (second case). In these cases, the second metallization can be deposited discontinuously on the bottom side of the insulator substrate.

Figure 12:
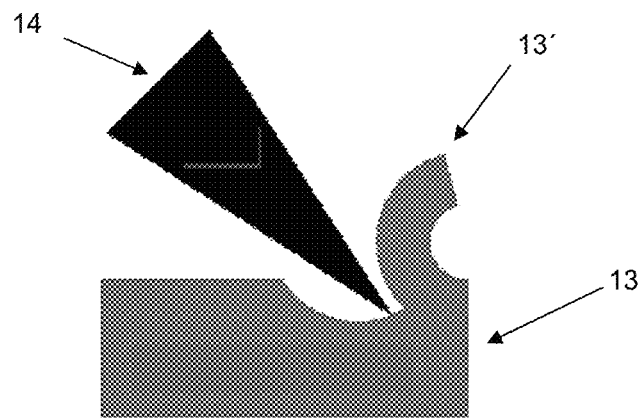

Alternatively, the second metallization can also remain on the insulator substrate over its entire surface, i.e. the structuring for direct cooling, which in this case is only formed by partial removal or peeling and/or bending of the metallization, does not extend to the insulator substrate. In this case, it is therefore intended that the second metallization is continuously applied to the bottom side of the insulator substrate. According to the present invention, the term "peeling and/or bending" is understood to mean the exposing of partial areas from the second metallization, whereby no removal of the metallization in the sense of ablation of the metallization takes place. The peeled off part remains connected to the second metallization and is bent in such a way that it protrudes from the metallization and thus increases the surface area of the second metallization which comes into contact with the cooling medium. Due to the process of peeling and/or bending the second metallization, the mass of the metallization remains unchanged before and after "peeling". A corresponding representation of this structuring is shown in FIG. 12.

The geometric shapes of the second metallization, which are preferably formed by punching (forming recesses) embossing (forming embossments) or partial punching and/or peeling and/or bending (forming exposed portions) are also collectively referred to as structuring in the context of the present invention.

The structurings of the second metallization on the sides facing away from the insulator substrate, which are formed prior to bonding with the insulator substrate, which are produced preferably by punching, embossing or partial punching or peeling and/or bending, have a height of at least 700 μm, preferably at least 800 μm, still further preferably at least 900 μm, still further preferably at least 1000 μm, still further preferably more than at least 1000 μm. Other suitable heights are defined above. The structurings, which are preferably created by punching, embossing or partial punching or peeling and/or bending on the side of the second metallization facing away from the insulator substrate, can have a height (h) that is greater than the layer thickness of the second metallization itself. A corresponding example is shown in FIGS. 11a) and 11b) for explaining the structure.

The structures have a height (h) of preferably not more than 15000 μm, even more preferably not more than 12000 μm, even more preferably not more than 10000 μm, even more preferably not more than 8000 μm, even more preferably not more than 5000 μm, even more preferably not more than 3000 μm.

The structures have a height (h) of preferably 700-15000 μm, preferably 800-15000 μm, preferably 900-15000 μm, preferably 1000-15000 μm, preferably >1000-15000 μm.

The structures have a height (h) of preferably 700-12000 μm, even more preferably 800-12000 μm, even more preferably 900-12000 μm, even more preferably 1000-12000 μm, even more preferably >1000-12000 μm.

The structures have a height (h) of preferably 700-10000 μm, still further preferred 800-10000 μm, still further preferred 900-10000 μm, still further preferred 1000-10000 μm, still further preferred >1000-10000 μm.

The structures have a height (h) of preferably 700-8000 μm, still further preferred 800-8000 μm, still further preferred 900-8000 μm, still further preferred 1000-8000 μm, still further preferred >1000-8000 μm.

The structures have a height (h) of preferably 700-5000 μm, still further preferred 800-5000 μm, still further preferred 900-5000 μm, still further preferred 1000-5000 μm, still further preferred >1000-5000 μm.

The structures have a height (h) of preferably 700-3000 μm, even more preferred 800-3000 μm, even more preferred 900-3000 μm, even more preferred 1000-3000 μm, even more preferred >1000-3000 μm.

In the context of the present invention, the height of the structuring is understood to be the maximum distance of the second metallization from the base area of the second metallization, whereby, the base area of the second metallization runs essentially parallel to the insulator substrate, and is continuous, i.e. uninterrupted, and
has the largest distance to the insulator substrate.

If the second metallization is completely removed in some areas (recess) and thus not continuous, i.e. uninterrupted, the base area is formed by the insulator substrate. In the case of a DCB arrangement in which a copper layer may be provided between the ceramic substrate and the second metallization, the base is formed by this (intermediate) copper layer; this prevents contact of the cooling medium with the insulator substrate, which can be particularly advantageous for DCB applications.

A discontinuous application of the second metallization with recesses in the second metallization is preferred.

The metal insulator substrate according to the invention can be a DCB arrangement, a DAB arrangement, an AMB arrangement or a TFCB arrangement.

Figure 10:
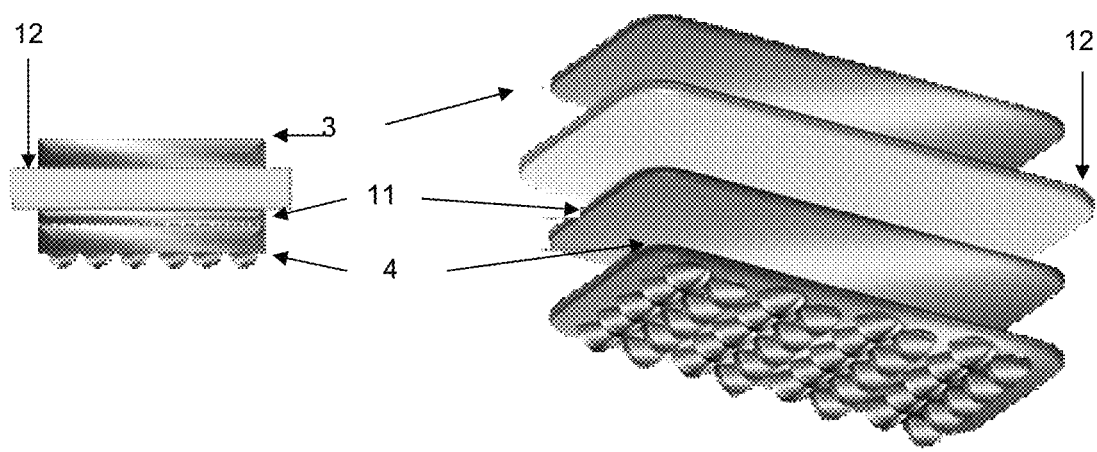

DCB Arrangement:

In the DCB arrangement (also DBC arrangement), a copper foil (as first and second metallization) is directly bonded onto a ceramic substrate (as insulator substrate) using the well-known DCB process. Alternatively, a further copper layer can be provided between the ceramic substrate and the second metallization. A corresponding representation of this structuring, in which a copper layer is present between the second metallization and the ceramic substrate, is shown in FIG. 10.

DAB Arrangement:

In the DAB-arrangement (also DBA-arrangement), an aluminum foil is bonded as first and second metallization directly onto a ceramic substrate (as insulator substrate) with the known DAB-process; in this case, the second aluminum metallization on the bottom side of the ceramic substrate may already be pre-structured for direct cooling or may be provided with a structuring for direct cooling after the bonding.

AMB Arrangement:

In an AMB-arrangement (also AMC-arrangement), a metallization, for example a copper metallization, is soldered as first and second metallization onto a ceramic substrate (as insulator substrate), whereby usually a metal, for example titanium, is added to the soldering composition. The soldering of the second metallization onto the ceramic substrate can, for example, first be carried out over the entire surface with subsequent structuring for direct cooling, or the soldering process of the metallization can be carried out while the structuring for direct cooling is already formed.

TFCB Arrangement:

In a TFCB arrangement, a ceramic substrate (as an insulator substrate) is used, whereby the metallizations are bonded to the ceramic substrate via a thick film paste, for example containing a metal and $Bi_2O_3$ or a metal and possibly a glass material. Also in this case the metallization intended as a second metallization on the bottom side of the ceramic substrate for direct cooling can be structured before or after bonding with the insulation substrate for direct cooling. Corresponding metal-insulator substrates are known from WO 2017/108939 A, the disclosure of which is included by reference in the present invention.

In these arrangements, it is usually intended that the second metallization is applied directly to the insulator substrate, possibly via an active soldering compound (AMB) or a thick film paste (TFCB). The production of these metal-insulator substrates according to the invention is carried out according to the above-described and expertly known methods of bonding.

In these cases, the metal-insulator substrate of the invention usually has a ceramic substrate generally selected from the group consisting of aluminum oxide, aluminum nitride, silicon nitride, silicon carbide and a mixed ceramic of aluminum oxide or aluminum nitride and zirconium oxide.

However, in the context of the present invention, the insulator substrate may also differ from a ceramic substrate and be formed, for example, by a plastic film or a resin-coated metal substrate. These arrangements are for example an ISS arrangement.

ISS Arrangement:

In the ISS arrangement, metal foils are bonded as first and second metallization to a plastic foil or a resin-coated metal substrate (as an insulator substrate) by, for example, an adhesive layer. In this case, the second metallization on the bottom side of the plastic film or the coated metal substrate can already be pre-structured for direct cooling or, after bonding, be provided with a structuring for direct cooling.

The metal-insulator substrate according to the invention is usually arranged in an enclosing housing, whereby the housing generally additionally encloses a cooling medium.

The cooling medium used to cool the metal-insulator substrate of the invention, which flows around the second metallization in particular at the generated structuring, can be liquid or gaseous, but preferably liquid.

In addition, the metal-insulator substrate according to the invention usually has a first metallization. This first metallization on the side of the insulator substrate opposite the second metallization usually has circuit electronics, for example, structuring for the formation of at least one power and/or logic component, structuring of conductor paths, structuring of contact surfaces and/or mounting surfaces for electrical components.

A further object of the present invention is a process for producing the metal-insulator substrate according to the invention, comprising
  a. an insulator substrate with at least one top side and at least one bottom side;
  b. a first metallization on the upper side of the insulator substrate, which is intended for the formation of a circuit electronics or is provided with at least one circuit electronics; and
  c. a second metallization on the bottom side of the insulator substrate.

The process according to the invention is characterized by at least the following process steps
  1. providing an insulator substrate with at least one upper side and at least one bottom side; and
  2. applying the second metallization to the bottom of the insulator substrate,
  wherein the second metallization already has a structuring suitable for direct cooling when it is applied to the insulator substrate or the second metallization is provided with a structuring suitable for direct cooling after application to the isolator substrate.

The basic difference between the second metallization and the teaching of the publication WO 2013/120486 A is that the second metallization preferably already has a structuring in the form of recesses or embossing, preferably produced by punching or embossing, before it is applied to the insulator substrate. The process according to the invention is characterized in particular by the following process steps:
  1'. provision of an insulator substrate with at least one top side and at least one bottom side;
  1". providing a second metallization with a structuring for direct cooling; and 2. apply the second metallization to the bottom of the insulator substrate, Corresponding metal-insulator substrates have already been described in more detail above (DCB, DAB, AMB, TFCB and ISS arrangements); reference is made to the previous explanations.

The metallization applied in this process is, in the sense of the present invention, the second metallization which—as described above—serves for direct cooling of the metal-insulator substrate.

If a metal foil is used in the process according to the invention, which is still unstructured and the resulting metallization is structured after bonding, the structuring can be achieved by embossing, punching or partial punching and/or bending. In particular, the structuring can be formed by a partial removal or peeling and/or bending of the metallization. According to the present invention, the term "peeling and/or bending" is understood to mean the removal of partial areas from the second metallization, whereby no removal of the metallization in the sense of ablation of the metallization takes place. The peeled-off part remains connected to the second metallization and is bent, if necessary, so that it protrudes from the metallization and thus the surface of the second metallization, which comes into contact with the cooling medium, is increased. In other words, the mass of the metal foil remains unchanged before and after peeling. A corresponding representation of this structuring is shown in FIG. 12.

If a metal foil that is already structured is used in the process according to the invention, the structuring can also be achieved in the metal foil by embossing, punching or partial punching or peeling and/or bending before it is applied to the insulator substrate.

Parallel to the creation of the second metallization (pre-structured or unstructured) on the underside of the insulator substrate, metallization can be carried out on the upper side of the insulator substrate by a bonding process, on which appropriate circuit electronics are then provided. The first metallization can also be produced before or after the second metallization.

In addition, the present invention relates to the use of the previously described metal insulator substrate in circuit electronics and a power semiconductor module comprising the previously described metal-insulator substrate.

This use is particularly characterized in that the cooling is performed by a medium which is in direct contact with the second metallization; if the second metallization has structures for direct cooling which are formed by recesses in the second metallization, the cooling medium used is also in direct contact with the insulator substrate or a material which is used to bond the second metallization to the insulator substrate.

The present invention is explained in more detail in the following Figures. The following reference signs are used in these Figures:

1: Metal-insulator substrate according to the invention
2: Isolator substrate
3: first metallization
4: second metallization
5: Structuring of the second metallization
6: Interlayer in a metal-insulator substrate manufactured by the TFCB process according to the invention
7: Intermediate layer in a metal-insulator substrate manufactured by the AMB process according to the invention
8. an interlayer in a metal-insulator substrate of the invention made by soldering, sintering or bonding
9: Seal
10: Housing
11: Intermediate layer (copper layer) in the case of a metal-ceramic substrate according to the DCB process
12: Ceramic substrate
13: Substrate copper
13': "peeled" part of the copper metallization
14: Tool for "peeling
15: conical shape
16: cylindrical shape
h: Height of the characteristics FIG. 1 shows a metal-insulator substrate 1, which has a first and a second metallization 3, 4 on an isolator substrate 2. The first metallization 3 is used to accommodate circuit electronics not shown, while the second metallization 4 has a structuring 5 for direct cooling. This metal-insulator substrate 1 is an arrangement that is manufactured using the DCB process.

Figure 2:
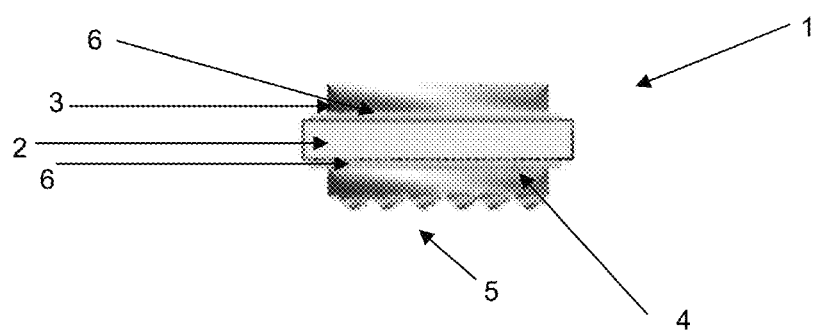

FIG. 2 shows a metal-insulator substrate 1, which has a first and a second metallization 3, 4 on an isolator substrate 2. The first metallization 3 is used to accommodate circuit electronics not shown, while the second metallization 4 has a structuring 5 for direct cooling. This metal-insulator substrate is a device manufactured by the TFCB process and therefore has an intermediate layer 6 between the insulator substrate and the first and second metallization. The interlayer is formed by a thick film paste containing a metal and $Bi_2O_3$ or a metal and optionally a glass material. In the context of the present invention, the interlayer 6 may be present between the insulator substrate 2 and both metallizations 3, 4 or only between the insulator substrate 2 and metallization 3 or 4.

Figure 3:
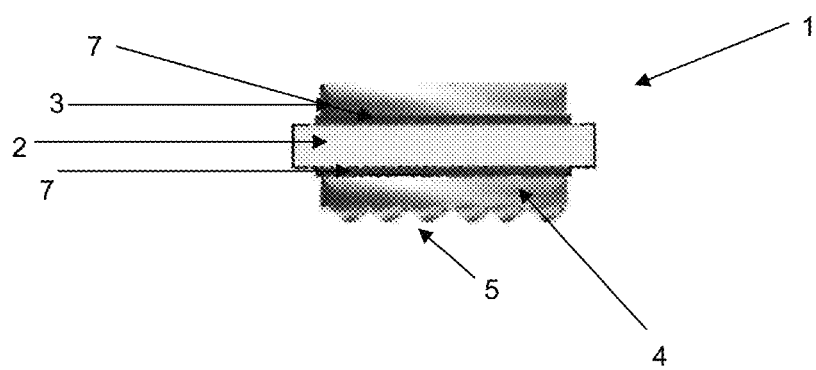

FIG. 3 shows a metal-insulator substrate 1 according to the invention, which has a first and a second metallization 3, 4 deposited on an isolator substrate 2. The first metallization 3 is used to accommodate circuit electronics not shown, while the second metallization 4 has a structuring 5 for direct cooling. This metal-insulator substrate is a device which is manufactured according to the AMB process and therefore has an intermediate layer 7 as brazing solder between the insulator substrate and the metallization. In the context of the present invention, the intermediate layer 7 may be present between the insulator substrate 2 and both metallizations 3, 4 or only between the insulator substrate 2 and metallization 3 or 4.

Figure 4:
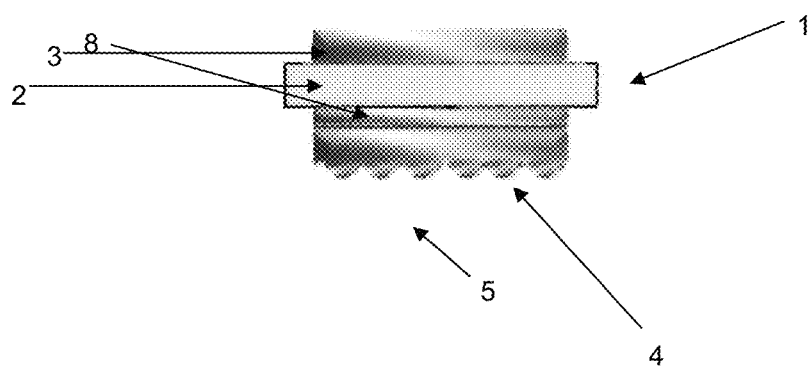

FIG. 4 shows a metal-insulator substrate 1 according to the invention, which has a first and a second metallization 3, 4 deposited on an isolator substrate 2. The first metallization 3 is used to accommodate circuit electronics that are not shown, while the second metallization 4 has a structure 5 for direct cooling. This metal-insulator substrate is an arrangement that is generally made by soldering, sintering or bonding and therefore has a corresponding intermediate layer 8 between the insulator substrate and the second metallization. In the context of the present invention, the interlayer 8 may be between the insulator substrate 2 and both metallizations 3, 4 or only between the insulator substrate 2 and metallization 3 or 4. In FIG. 4, the interlayer 8 is only between the insulator substrate 2 and the metallization 4.

FIG. 5 shows a possible structuring 5 of a metal-insulator substrate 1 according to the invention on the second metallization 4 on the side facing away from the insulator substrate 2. The structuring 5 is designed to result in a concave-convex structure. The cooling medium, which is not shown in this figure, flows along the concave-convex structure and cools the metal-insulator substrate 1.

FIG. 6 shows a possible structuring 5 of a metal-insulator substrate 1 according to the invention at the second metallization 4 on the side facing away from the insulator substrate 2. The structuring 5 is designed to result in a pin-fin structure. The cooling medium, which is not shown in this figure, flows along the pin fin structure and cools the metal-insulator substrate 1.

Figure 7:
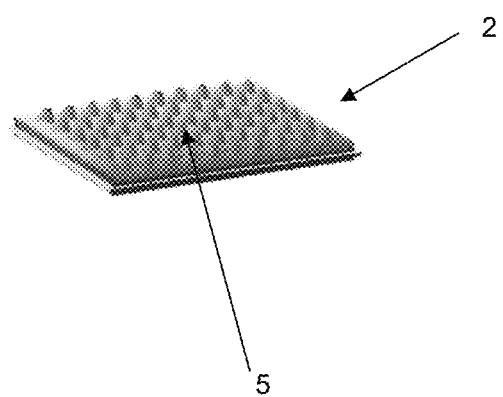

FIG. 7 shows a possible structuring 5 of a metal-insulator substrate 1 according to the invention at the second metallization 4 on the side facing away from the insulator substrate 2. The structuring 5 is designed in such away that a burled structure results. The cooling medium, which is not shown in this figure, flows along the nap-structure and cools the metal-insulator substrate 1.

Figure 8:
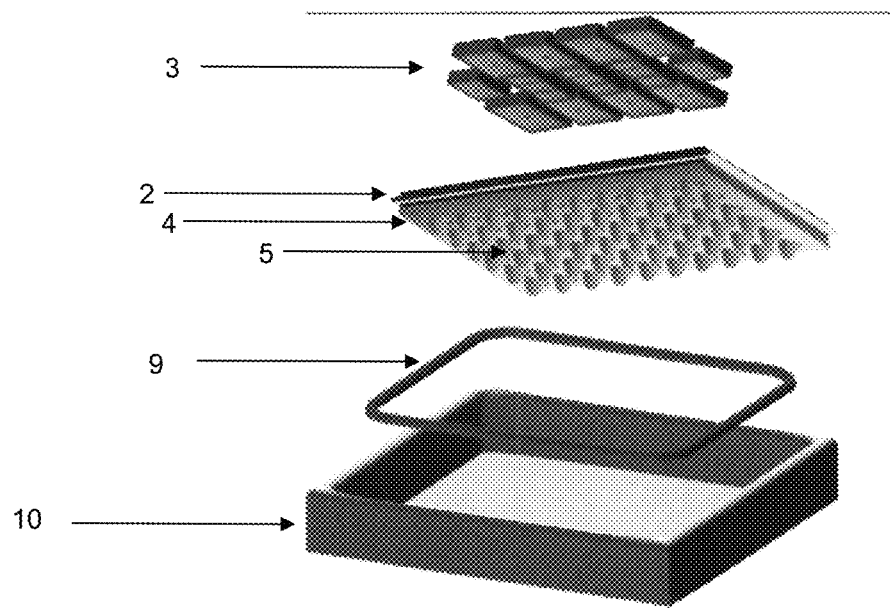

FIG. 8 shows a schematic three-dimensional structure of a power semiconductor module according to the invention. Shown is the first metallization 3, which is now structured to accommodate power electronics, the insulator substrate 2 and the second metallization 4, which has a nap-structure on the bottom side. The metal-insulator substrate 1 is placed in a housing 10 and is provided with a seal 9. The housing 10 has openings for the inlet and/or outlet of the cooling medium, which are not shown.

FIG. 9 shows a possible structuring 5 of a metal-insulator substrate 1 according to the invention at the second metallization 4 on the side facing away from the insulator substrate 2. The structuring 5 is designed to result in protruding features. The cooling medium flows along this structuring and cools the metal-insulator substrate 1.

FIG. 10 shows a possible structuring of a DCB-arrangement. Between the ceramic substrate 12 and the second metallization 4, a further copper layer 11 can be provided.

FIGS. 11 a) and b) show two different representations of a possible structuring of a pre-structured metal foil produced by "partial punching and/or bending". As can be seen, the "punched" parts of the metallization are not removed. The "separated" part remains connected to the second metallization and is bent so that this part protrudes from the second metallization and thus increases its surface area. In this process, there is no removal of mass in the sense of ablation, so the mass of the metal foil remains unchanged before and after the "partial punching and bending". The value h represents the height of the embossments or the protruding parts of the second metallization, whereby this height can be greater than the layer thickness of the second metallization itself.

FIG. 12 is a schematic representation of a structure formed by peeling and/or bending the second metallization. According to this structuring, parts of the second metallization are peeled off, whereby no removal of the metallization in the sense of ablation of the metallization takes place. The peeled-out part remains connected to the second metallization and is bent in such a way that it protrudes from the metallization and thus increases the surface area of the second metallization that comes into contact with the cooling medium. Due to the process of peeling and/or bending the second metallization, the mass of the metallization before and after "peeling" remains essentially unchanged.

FIG. 13 is a schematic representation of a further embodiment of the structure of the second metallization 4 of the metal-insulator substrate 1 according to the invention, whereby the embossments are provided with roundings. This shaping is particularly advantageous if a metal foil which is already structured is used in the process according to the invention. This shaping of the embossments with roundings strengthens the stabilization of the embossments during the bonding, so that the metal (e.g. Cu), which is soft due to the heat of the bonding, does not collapse.

FIG. 14 is a schematic representation of invented embossments with different roundings. FIG. 14 a) corresponds to a cone-shaped rounding 15 of the embossing, whereas FIG. 14 b) corresponds to a cylindrical rounding 16 of the embossing.

The invention claimed is:

1. A metal-insulator substrate comprising:
    an insulator substrate with at least one upper side and at least one bottom side;
    a first metallization on the upper side of the insulator substrate, configured for the formation of a circuit electronics or provided with at least one circuit electronics; and
    a second metallization on the bottom side of the insulator substrate;
    wherein the second metallization of the metal insulator substrate is a cooling element, the second metallization for direct cooling is provided with a structuring in such a way that the area of the second metallization available for cooling is increased by embossments in comparison with a planar structure of the second metallization, and the embossments have a height that is greater than the layer thickness of the second metallization itself, wherein the layer thickness of the second metallization is more than 1000 μm; and
    wherein the structuring of the second metallization is formed by a punching process or by a process of partial punching, peeling and/or bending of the metallization, such that part of the metallization is protruding from its original planar structure and such that there is no removal of mass from the second metallization, in the sense of ablation.

2. The metal-insulator substrate according to claim 1, wherein the second metallization has a structuring on the side facing away from the insulator substrate in such a way that cooling can be effected by a cooling medium.

3. The metal-insulator substrate according to claim 2, wherein the second metallization on the side facing away from the insulator substrate is structured in such a way that flow and/or cooling channels are created.

4. The metal-insulator substrate according to claim 1, wherein the second metallization is formed by a pre-structured metal foil from which a part of the metallizations has been removed from the original metal foil plane or in which a part of the metallizations is protruding from the original metal foil plane.

5. The metal-insulator substrate according to claim 1, wherein the structuring of the second metallization provided for cooling is needle-shaped, has a concave-convex structure, a pin-fin structure and/or a ribbed structure.

6. The metal-insulator substrate according to claim 1, wherein the second metallization is formed by a metal foil.

7. The metal-insulator substrate according to claim 1, wherein the metal-insulator substrate has no further cooling elements besides the second metallization.

8. The metal-insulator substrate according to claim 1, wherein the metal-insulator substrate is arranged in an enclosing housing.

9. The metal-insulator substrate according to claim 8, wherein the housing additionally comprises a cooling medium.

10. A power semiconductor module comprising at least one of the metal-insulator substrates according to claim 1.

11. Use of a metal-insulator substrate according to claim 1 in circuit electronics.

12. A process for producing a metal-insulator substrate comprising:
- an insulator substrate with at least one upper side and at least one bottom side;
- a first metallization on the upper side of the insulator substrate, which is intended for the formation of a circuit electronics or is provided with at least one circuit electronics; and
- a second metallization on the bottom side of the insulator substrate;
- wherein the following process comprises:
- providing an insulator substrate having at least one upper side and at least one bottom side;
- bonding a metal foil to the bottom side of the insulator substrate;
- wherein the metal foil already has a structuring on the side facing away from the insulator substrate before bonding or the metallization is subjected to a structuring after bonding and the structuring has embossments with a height of at least 1000 µm; and
- punching or partially punching, peeling and/or bending the second metallization, such that part of the second metallization protrudes from the original planar structure of the second metallization and such that there is no removal of mass from the second metallization, in the sense of ablation, with the punching, partial punching, peeling or bending.

13. The process according to claim 12, wherein the structuring of the metallization is carried out by stamping, punching and/or bending after or before the bonding step.

14. The process according to claim 12 for the production of a metal-ceramic substrate comprising:
- an insulator substrate with at least one upper side and at least one bottom side;
- a first metallization on the upper side of the insulator substrate, configured for the formation of a circuit electronics or provided with at least one circuit electronics; and
- a second metallization on the bottom side of the insulator substrate;
- wherein the second metallization of the metal insulator substrate is a cooling element, the second metallization for direct cooling is provided with a structuring in such a way that the area of the second metallization available for cooling is increased by embossments in comparison with a planar structure of the second metallization, and the embossments have a height of at least 1000 µm.

* * * * *